June 20, 1967

M. J. HALISTA 3,327,223

ELECTRICAL APPARATUS

Filed Aug. 25, 1964

INVENTOR.
MITCHELL J. HALISTA

BY Arthur H. Swanson

ATTORNEY.

United States Patent Office 3,327,223
Patented June 20, 1967

3,327,223
ELECTRICAL APPARATUS

Mitchell J. Halista, Philadelphia, Pa., assignor to Honeywell Inc., Minneapolis, Minn., a corporation of Delaware Filed Aug. 25, 1964, Ser. No. 391,849
2 Claims. (Cl. 328—229)

This invention relates to fluid amplifiers. More specifically, the present invention relates to fluid logic elements capable of performing logic control functions without the use of moving mechanical parts.

An object of the present invention is to provide an improved fluid logic element for performing logic functions with fluid streams to produce predetermined output signals.

It has been discovered that a fluid-operated logic system having no moving mechanical parts could be constructed so as to provide a fluid amplifier in which the effective proportion of the total energy of a fluid stream delivered to an output conduit is controlled by a control fluid stream having substantially less energy. One type of fluid amplifier utilizes boundary layer control to effect the interaction between the fluid stream and the control fluid. In the boundary layer control fluid amplifier, a fluid stream is directed to an output conduit by the pressure distribution between the stream and a pair of side walls. The stream is directed to a side wall by the control fluid where the stream then attaches itself onto the side wall and remains in this locked-on condition without further action of the control fluid. A pair of control fluid nozzles are provided to produce a selective movement of the fluid stream between the side walls. The nozzles are used to provide a control fluid to disturb the locked-on condition of the fluid stream and to produce a subsequent deflection of the stream to the opposite side wall. The control fluid is only used to affect the pressure distribution between the stream and the side wall and, thus, is a low energy fluid. Since the controlled stream has a higher energy than the control fluid, an energy gain, or amplification, is achieved by the fluid amplifier.

The use of such fluid amplifiers has been limited by the necessity of assembling each logic unit in a fluid system having fluid carrying conduits between the outputs of one logic element and an input of a succeeding element, the output of an element and a visual readout or controlled device and between the input and output of an element in a feedback loop arrangement. Such fluid systems are severely limited in their adaptability to electronic system control and/or readout devices as well as direct utilization of electronic computer address signals.

Another object of the present invention is to provide an improved fluid amplifier logic system having capabilities for directly using and producing electrical signals.

A further object of the present invention is to provide an improved fluid logic element having electrical output signals representative of a fluid flow.

A still further object of the present invention is to provide an improved fluid logic element using a fluid amplifier having electrical input and output signals.

Still another object of the present invention is to provide an improved fluid amplifier element having internal conversion of fluid signals to electrical signals.

Still another further object of the present invention is to provide an improved fluid amplifier using electrical feedback signals.

In accomplishing these and other objects, there has been provided, in accordance with the present invention, a fluid logic element comprising a fluid amplifier and a source of ionized fluid forming a fluid stream supply for the fluid amplifier. The output conduits from the fluid amplifier is arranged to support electrically conductive windings thereon to provide an electromagnetically responsive means to said ionized streams. The windings are connected to electrical output terminals to provide an electrical signal representative of the fluid stream flow. The fluid amplifier may be provided with input signal means responsive to the electrical signals from the output windings to provide a feedback system for the fluid logic element.

A better understanding of the present invention may be had when the following detailed description is read in connection with the accompanying drawings, in which.

Figure 1:
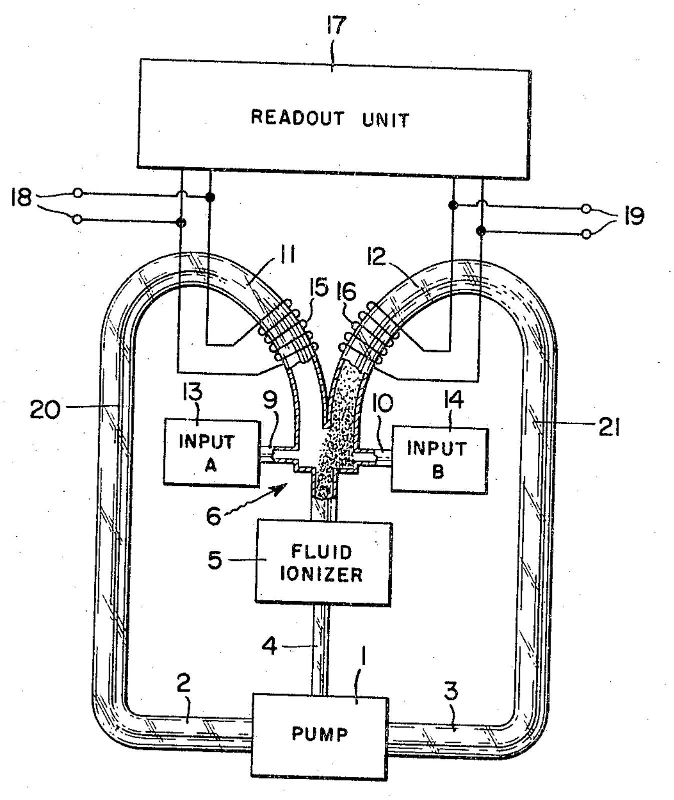
FIG. 1 is a pictorial representation of a fluid amplifier logic component embodying the present invention.

Referring to FIG. 1 in more detail, there is shown a fluid amplifier logic component comprising a fluid pump 1 having a pair of fluid inlets 2 and 3 and a fluid outlet 4. The fluid outlet 4 is connected to supply a pumped fluid to an ionizer device 5. This ionizer 5 is effective to continuously ionize the pumped fluid; i.e., produce an electrostatic charge therein. The ionized fluid is supplied to a fluid amplifier 6 having a pair of signal input ports 9, 10 and a pair of signal output conduits 11, 12.

The input ports 9 and 10 are connected to input signal sources 13 and 14, respectively. The input sources 13 and 14 are effective to supply separate input signals to the fluid amplifier 6 to control the flow of the ionized fluid through the output conduits 11 and 12. An electrically conductive winding is wrapped around each of the output conduits 11 and 12. Thus, a winding 15 is disposed on conduit 11, and winding 16 on conduit 12. The windings 15 and 16 are connected to a readout unit 17 and to respective output terminals 18 and 19. The output conduits 11 and 12 are connected to the inlets 2 and 3 of the pump 1. Thus, a return pipe 20 is arranged to connect conduit 11 to inlet 2, and a return pipe 21 connects conduit 12 to inlet 3.

Figure 2:
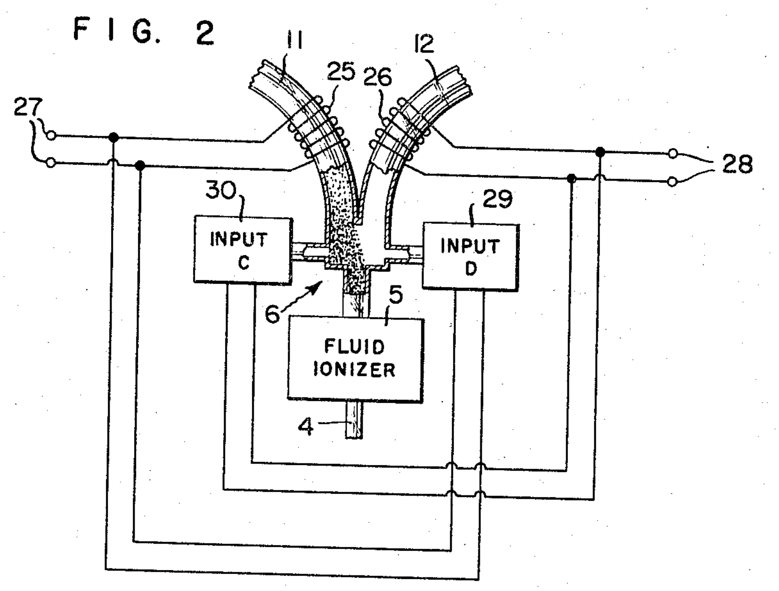
FIG. 2 is a modification of the structure shown in FIG. 1 also embodying the present invention.

In FIG. 2, there is shown a portion of the present invention illustrating a modified structure over the embodiment shown in FIG. 1. The return pipes 20 and 21 and the pump 1 are omitted since they would be identical to the elements shown in FIG. 1. The fluid amplifier 6 with output conduits 11 and 12 is shown in FIG. 2 with electrical windings 25 and 26 on the conduits 11 and 12, respectively. Winding 25 is connected to a pair of output terminals 27, and winding 26 to terminals 28. Additionally, winding 25 is connected to supply a control signal to an input signal device 29. The input device 29 is arranged to respond to the control signal to affect the ionized fluid within the fluid amplifier 6. Similarly, the winding 26 is connected to supply a control signal to an input signal device 30 which device provides an opposite effect on an output signal from the fluid amplifier from the effect of a control signal from the input device 29.

In operation, the fluid amplifier element of the present invention is arranged to produce a selective positioning of the fluid stream in either of the two output conduits 11 and 12. Thus, an input signal applied by either input 13 or input 14 is effective to affect the fluid flow in the amplifier to switch the stream between the outputs 11 and 12. As shown in FIG. 1, the inputs 13 and 14 may be control fluids which are arranged to change the pressure distribution across the fluid stream and cause the stream to switch to the opposite output conduit. Alternatively, since the fluid stream is ionized, the inputs 13 and 14 may be electromagnetic or electrostatic devices which would either repel or attract the ionized fluid stream to a desired output.

The ionized stream flows through a winding on the output conduit to produce an induced electrical signal. For example, as shown in FIG. 1, the stream flowing through winding 16 produces an electrical signal that is fed to a readout unit 17 to indicate the state of amplifier 6. After leaving the winding 16, the stream flows through return pipe 21 to the pump 1 and ionizer 5. The ionizer 5 is effective to maintain a level of ionization of the fluid stream to produce the induced signal in winding 16. The boundary layer flow of the fluid stream produces a locked-on condition of the fluid stream on the wall of the output conduit 16 until a suitable input signal is applied to inputs 13 and 14 to switch the stream. For example, a fluid input applied to input 14 would be effective to disturb the pressure distribution across the fluid stream and produce a lifting of the stream from the wall of the conduit 16. The freed stream would, then, switch to output conduit 11 and attach itself to the wall thereof. This new position of the fluid stream would be effective to induce a signal in winding 15 for application to readout unit 17. Output terminals 18 and 19 are provided for further use of the electrical output signal produced by the fluid stream. These output signals may be used for direct control of electrical valves, stepping motors and other industrial and commercial devices using electrical signals for inputs.

As shown in FIG. 2, another use of the electrical output signals of the present invention would be to produce an oscillator element of the amplifier 6 by individually connecting the electrical signals to input means 29 and 30. These input devices would affect the fluid stream in the amplifier 6 either through conversion to fluid signals or directly by electrical attraction of the ionized stream. In this embodiment, the amplifier 6 would act as a free-running oscillator to produce periodically occurring signals on the output windings 25 and 26; i.e., the position of the fluid stream would produce an output signal to switch the stream to the opposite output conduit. Output terminals 27 and 28 are provided to connect the electrical oscillator output signal to other related devices for control or indication. It is to be noted that other combinations of the fluid amplifier element of the present invention may be used without departing from the scope of this invention. For example, the amplifier 6 may be used in interconnected arrangements with one stage supplying electrical signals to another amplifier stage as input signals without the need of fluid conduits for interconnecting the stages. Thus, many logic devices such as gates, counters, memories, etc. may be constructed with a great simplification in the mechanical structure required.

Accordingly, it may be seen that there has been provided, in accordance with the present invention, a fluid amplifier element having internal conversion between fluid output signals and equivalent electrical signal and capable of utilizing either electrical or fluid input signals to form logic elements for producing predetermined output signals.

What is claimed is:

1. A fluid amplifier logic element comprising a fluid amplifier having a pair of input signal means operative in response to input signals to individually affect a fluid stream in said amplifier, a first and a second fluid stream output conduit and a fluid stream inlet conduit, ionizing means arranged to ionize a fluid stream for said amplifier supplied to said inlet conduit, a first electrically conductive means disposed on said first output conduit, a second electrically conductive means disposed on said second output conduit, said first and second conductive means including respective pairs of output terminals connected thereto, and circuit means connecting said first conductive means to one of said input means and said second conductive means to the other of said input means for establishing an electrical output and feedback directly representative of said fluid amplifier.

2. A fluid amplifier logic element comprising a first input signal means and a second input signal means, each of said means being operative to disturb the boundary layer flow of a fluid stream in said amplifier in response to applied input signals for switching said fluid stream between respective stable flow states, a first output conduit arranged to receive said fluid in one of said states associated with said first input means and a second output conduit arranged to receive said fluid in the other of said states associated with said second input means, fluid ionizing means arranged to supply said fluid stream to said amplifier at a predetermined ionization level, a first electrical winding disposed on said first output conduit and a second electrical winding disposed on said second output conduit, said first and said second windings each being arranged to have an electrical signal induced therein by said ionized fluid flowing through said conduit associated therewith, circuit means connecting said first and said second windings to respective electrical output terminals, and further circuit means operative to connect said first winding to said second input signal means and said second winding to said first input signal means for establishing an electrical output and feedback directly representative of said fluid amplifier.

References Cited

UNITED STATES PATENTS

| | | | |
|---|---|---|---|
| 2,920,215 | 1/1960 | Lo | 307—88.5 |
| 2,951,183 | 8/1960 | Manfredi | 324—33 |
| 3,071,154 | 1/1963 | Cargill et al. | 313—231 |
| 3,258,685 | 6/1966 | Horton | 324—33 |

ARTHUR GAUSS, *Primary Examiner.*

B. P. DAVIS, *Assistant Examiner.*